United States Patent
Van Sluytman

(10) Patent No.: US 12,006,843 B2
(45) Date of Patent: Jun. 11, 2024

(54) METHODS FOR FORMING HIGH TEMPERATURE COATING SYSTEMS AND GAS TURBINE ENGINE COMPONENTS INCLUDING THE SAME

(71) Applicant: HONEYWELL INTERNATIONAL INC., Morris Plains, NJ (US)

(72) Inventor: Jason S. Van Sluytman, Phoenix, AZ (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 912 days.

(21) Appl. No.: 16/657,303

(22) Filed: Oct. 18, 2019

(65) Prior Publication Data

US 2020/0049019 A1  Feb. 13, 2020

Related U.S. Application Data

(62) Division of application No. 15/635,999, filed on Jun. 28, 2017, now abandoned.

(51) Int. Cl.

| C23C 28/04 | (2006.01) |
| C23C 4/134 | (2016.01) |
| C23C 16/06 | (2006.01) |
| C23C 28/00 | (2006.01) |
| C23C 30/00 | (2006.01) |
| F01D 5/28 | (2006.01) |

(52) U.S. Cl.
CPC .............. *F01D 5/288* (2013.01); *C23C 4/134* (2016.01); *C23C 16/06* (2013.01); *C23C 28/042* (2013.01); *C23C 28/048* (2013.01); *C23C 28/3215* (2013.01); *C23C 28/3455* (2013.01); *C23C 28/40* (2013.01); *C23C 30/005* (2013.01); *F05D 2220/32* (2013.01); *F05D 2230/90* (2013.01); *F05D 2300/611* (2013.01)

(58) Field of Classification Search
CPC .......................... C23C 28/042; C23C 28/3455
See application file for complete search history.

(56) References Cited

U.S. PATENT DOCUMENTS

| 5,851,678 | A | 12/1998 | Hasz et al. |
| 6,627,323 | B2 | 9/2003 | Nagaraj et al. |
| 6,933,066 | B2 | 8/2005 | Nagaraj et al. |
| 7,374,825 | B2 | 5/2008 | Hazel et al. |
| 7,638,178 | B2 | 12/2009 | Raybould et al. |
| 7,862,901 | B2 | 1/2011 | Darolia et al. |
| 8,470,460 | B2 | 6/2013 | Lee |
| 8,658,255 | B2 | 2/2014 | Kirby et al. |
| 8,859,052 | B2 | 10/2014 | Kirby et al. |
| 9,034,479 | B2 | 5/2015 | Nagaraj et al. |
| 9,121,295 | B2 | 9/2015 | Menuey et al. |
| 9,194,242 | B2 | 11/2015 | Lee |
| 2003/0029563 | A1 | 2/2003 | Kaushal et al. |
| 2006/0166018 | A1* | 7/2006 | Spitsberg ............... C04B 41/52 428/471 |
| 2007/0036997 | A1 | 2/2007 | Floyd |
| 2007/0160859 | A1 | 7/2007 | Darolia et al. |
| 2008/0145674 | A1* | 6/2008 | Darolia .................. F01D 5/288 427/403 |
| 2009/0186237 | A1 | 7/2009 | Lee |
| 2011/0300357 | A1 | 12/2011 | Witz et al. |
| 2014/0065433 | A1 | 3/2014 | Lau et al. |
| 2014/0065438 | A1 | 3/2014 | Lee |
| 2015/0191828 | A1 | 7/2015 | Tolpygo |
| 2016/0115818 | A1 | 4/2016 | Porob et al. |
| 2016/0115819 | A1 | 4/2016 | Nayak et al. |
| 2016/0168684 | A1 | 6/2016 | Brosnan et al. |
| 2016/0177746 | A1 | 6/2016 | Venkataramani et al. |
| 2017/0022113 | A1 | 1/2017 | Opila |

OTHER PUBLICATIONS

Pitek, A Study of the Zirconia-Yttria-Tantala System as a Potential Thermal Barrier Oxide, a dissertation, University of California, Santa Barbara, Dec. 2006, p. 1-198 (Year: 2006).*
Raghavan, The hot corrosion resistance of 20 mol% YTaO4 stabilized tetragonal zirconia and 14 mol% Ta2O5 stabilized orthorhombic zirconia for thermal barrier coating applications, Surface and Coatings Technology, 160, 2002, p. 187-196 (Year: 2002).*
MacAuley, C.A., et al. "Phase Equilibria in the ZrO2—YO1.5—TaO2.5 System at 1500 C", Journal of the European Ceramic Society 37 (Jun. 3, 2017) 4888-4901.

* cited by examiner

*Primary Examiner* — Tabatha L Penny
(74) *Attorney, Agent, or Firm* — Lorenz & Kopf LLP

(57) ABSTRACT

Methods for forming high temperature coating systems are provided. In embodiments, the coating formation method includes forming a fracture-resistant Thermal Barrier Coating (TBC) layer over a workpiece surface. The fracture-resistant TBC layer is produced from a first coating precursor material containing an amount of zirconia in mole percent ($ZrO_{mol\%1}$) and an amount of tantala in mole percent ($TaO_{mol\%1}$). A Calcium-Magnesium Aluminosilicate (CMAS) resistant TBC layer is formed over the fracture-resistant TBC layer from a second coating precursor material, which contains an amount of zirconia in mole percent ($ZrO_{mol\%2}$), an amount of tantala in mole percent ($TaO_{mol\%2}$), and an amount of one or more rare earth oxides in mole percent ($REO_{mol\%2}$). The first and second coating precursor materials are formulated such that $ZrO_{mol\%1}$ is greater than $ZrO_{mol\%2}$, $TaO_{mol\%1}$ is less than $TaO_{mol\%2}$, and $TaO_{mol\%2}$ is substantially equivalent to $REO_{mol\%2}$.

13 Claims, 2 Drawing Sheets

METHODS FOR FORMING HIGH TEMPERATURE COATING SYSTEMS AND GAS TURBINE ENGINE COMPONENTS INCLUDING THE SAME

CROSS-REFERENCE TO RELATED APPLICATIONS

The present application is a divisional of U.S. patent application Ser. No. 15/635,999, filed on Jun. 28, 2017, the contents of which are incorporated by reference herein in their entirety.

TECHNICAL FIELD

The present invention relates generally to high temperature coating systems and, more particularly, to methods for forming high temperature coating systems over components or workpieces, as well as to GTE components having surfaces over which such high temperature coating systems are formed.

Abbreviations

The following abbreviations appear throughout this document:
CMAS—Calcium-Magnesium Aluminosilicates;
CVD—Chemical Vapor Deposition;
EBC—Environmental Barrier Coating;
EB-PVD—Electron Beam Physical Vapor Deposition;
GTE—Gas Turbine Engine;
IGV—Inlet Guide Vane;
Mol %—Single cation mole percent;
REO—Rare Earth Oxide;
TBC—Thermal Barrier Coating;
TGO—Thermally Grown Oxide;
USPTO—United States Patent and Trademark Office;
Vol %—Volume percent; and
Wt %—Weight percent.

BACKGROUND

One of the most direct manners by which GTE performance can be enhanced is through increases in the core gas temperatures, such as the combustor outlet temperatures, at which the GTE operates. Increasing core gas temperatures, however, inexorably subjects GTE components located within the core gas flow path to higher surface temperatures and gas velocities. Consequently, increases in core gas temperatures tend to accelerate high temperature failure modes of GTE components, even when such components are fabricated from advanced ceramic or superalloy materials. Such high temperature failure modes are typically characterized by excessive structural degradation caused by hot gas corrosion, oxidation, thermomechanical fatigue, and the undesired formation of CMAS byproducts resulting from high temperature chemical reactions with airborne siliceous particulates ingested by the GTE (herein, "CMAS attack"). This is particularly true for those GTE components located immediately downstream of the GTE combustor section, such as early stage turbine rotor blades and turbine nozzle vanes, which are exposed to peak gas temperatures and flow velocities during GTE operation.

TBCs may be formed on selected GTE components to thermally insulate the component bodies from elevated surface temperatures and thereby prevent, or at least stave-off, high temperature failure modes. The formation of TBCs over selected GTE component surfaces can thus enable prolonged GTE operation at higher core temperatures to boost GTE performance, while reducing maintenance requirements. Traditionally, TBCs have been formed as single layer coatings composed predominately of zirconia ($ZrO_2$) stabilized with one or more additives, such as yttria ($Y_2O_3$). One such TBC formulation, which has gained widespread adoption within the aerospace industry, is yttria-stabilized zirconia (YSZ) containing 6% to 8% yttria by weight percent. More recently, advanced TBC systems have been introduced, which combine multiple coating layers to provide enhanced performance at temperatures approaching or exceeding 2000 degrees Fahrenheit (° F.) or 1090 degrees Celsius (° C.). Examples of such advanced TBC systems are described in co-pending U.S. patent application Ser. No. 14/312,869, filed with the USPTO on Jun. 24, 2014, and further discussed below. While generally achieving superior high temperature properties over less complex, single layer YSZ-based coatings, such multilayer TBC systems remain limited in certain respects. As a primarily limitation, there exist few, if any multilayer TBC systems that provide relatively high levels of thermal insulation, oxidation resistance, sinter resistance, and fracture resistance at elevated temperatures, while further providing relatively high resistance to CMAS attack.

There thus exists a continued demand within the aerospace industry for the development of advanced high temperature coating systems, which overcome some, if not all of the above-noted deficiencies associated with conventional high temperature coatings and multilayer coating systems. Relatedly, there exists an ongoing industry demand for the provision of aerospace components, particular GTE components, having surfaces protected by such high temperature coating systems. Such high temperature coating systems and coated GTE components are disclosed herein, as are methods for fabricating such coating systems in relatively consist, cost effective, and time efficient manners. Other desirable features and characteristics of embodiments of the present invention will become apparent from the subsequent Detailed Description and the appended Claims, taken in conjunction with the accompanying drawings and the foregoing Background.

BRIEF SUMMARY

Methods for forming high temperature coating systems are provided. In embodiments, the coating formation method includes forming a fracture-resistant TBC layer over a selected surface of a workpiece. The fracture-resistant TBC layer is produced from a first coating precursor material containing an amount of zirconia in mole percent ($ZrO_{mol\%1}$) and an amount of tantala in mole percent ($TaO_{mol\%1}$). A CMAS-resistant TBC layer is formed over the fracture-resistant TBC layer from a second coating precursor material, which contains an amount of zirconia in mole percent ($ZrO_{mol\%2}$), an amount of tantala in mole percent ($TaO_{mol\%2}$), and an amount of one or more rare earth oxides in mole percent ($REO_{mol\%2}$). The first and second coating precursor materials are formulated such that $ZrO_{mol\%1}$ is greater than $ZrO_{mol\%2}$, $TaO_{mol\%1}$ is less than $TaO_{mol\%2}$, and $TaO_{mol\%2}$ is substantially equivalent to $REO_{mol\%2}$. Additionally, in certain implementations, the one or more rare earth oxides may be selected from the group consisting of yttria, ytterbia, gadolinia, and lanthanum oxides, and combinations thereof.

In other embodiments, the coating formation method includes the step or process of forming a fracture-resistant TBC layer over a surface of a workpiece, substrate, or article of manufacture, such as a GTE component. The facture-resistant TBC layer may be produced to contain about 25% to about 75% zirconia and about 1% to about 30% tantala, by wt %. The coating formation method further includes the step or process of forming a CMAS-resistant TBC layer over and possibly in direct contact with the fracture-resistant TBC layer. The CMAS-resistant TBC layer may be produced to contain and, in certain cases, to consist essentially of 0% to about 25% zirconia by wt %, about 35% to about 55% tantala by wt %, and about 25% to about 40% of at least one rare earth oxide wt %. The coating formation method may further include the step or process of selecting the at least one rare earth oxide from the group consisting of yttria, ytterbia, gadolinia, and lanthanum oxides, and combinations thereof. In embodiments, the fracture-resistant TBC layer may contain lesser amounts of the at least one rare earth oxide and/or may be substantially free of the at least one rare earth oxide, as measured at an inner region of the fracture-resistant TBC layer opposite the CMAS-resistant TBC layer.

Embodiments of a coated or TBC-protected GTE component are further provided. In various embodiment, the coated GTE component includes a component body, which may be composed of a superalloy and which has at least one surface facing core gas flow when the GTE component is deployed within an operative GTE. A fracture-resistant TBC layer overlies the surface of the component body and, in certain implementations, may be bonded thereto through an intervening base TBC layer and/or an intervening bond coat. The fracture-resistant TBC layer contains a certain amount of zirconia (herein, "$ZrO_{mol\%1}$" in mol %), as well as a certain amount of tantala (herein, "$TaO_{mol\%1}$" in mol %). A CMAS-resistant TBC layer overlies and, in some embodiments, is intimately bonded to the fracture-resistant TBC layer. The CMAS-resistant TBC layer contains non-trace amounts of zirconia, tantala, and one or more rare earth oxides. The zirconia content of the CMAS-resistant TBC layer is less than that of the fracture-resistant TBC layer, which, in turn, may be less than the zirconia content of the base TBC layer in certain instances. Additionally, in some implementations, the rare earth oxide or oxides may be diffused into the CMAS-resistant TBC layer such that the CMAS-resistant TBC layer contains a gradient distribution of the rare earth oxides, which decreases in concentration with increasing distance from the interface between the CMAS-resistant TBC layer and the fracture-resistant TBC layer. In such implementations, the rare earth oxide or oxides can potentially include or consist essentially of gadolinia, in which case the fracture-resistant TBC layer may be essentially free of gadolinia as measured at an inner region of the fracture-resistant TBC layer opposite the CMAS-resistant TBC layer.

Various additional examples, aspects, and other useful features of embodiments of the present disclosure will also become apparent to one of ordinary skill in the relevant industry given the additional description provided below.

BRIEF DESCRIPTION OF THE DRAWINGS

At least one example of the present invention will hereinafter be described in conjunction with the following figures, wherein like numerals denote like elements, and.

Figure 1:
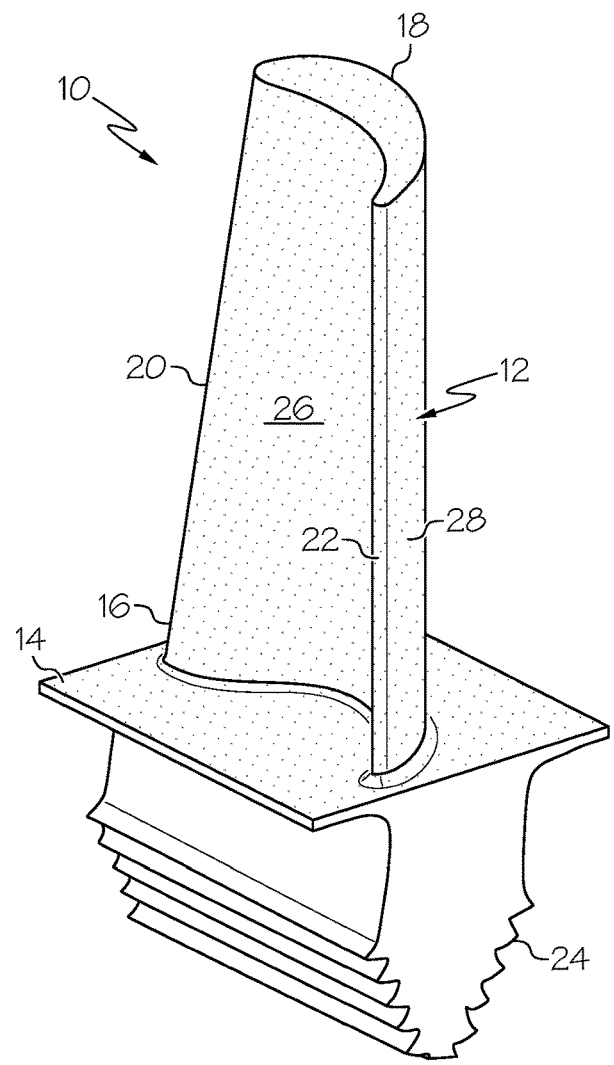
FIG. 1 is an isometric view of a GTE component and, specifically, a turbine rotor blade including gas-exposed surfaces over which a high temperature coating system is usefully formed, as illustrated in accordance with an exemplary embodiment of the present disclosure.

For simplicity and clarity of illustration, the drawing figures illustrate the general manner of construction, and descriptions and details of well-known features and techniques may be omitted to avoid unnecessarily obscuring the exemplary and non-limiting embodiments described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the TBC system and TBC-protected GTE components described herein.

DETAILED DESCRIPTION

The following Detailed Description is merely exemplary in nature and is not intended to limit the invention or the application and uses of the invention. Furthermore, there is no intention to be bound by any theory presented in the preceding Background or the following Detailed Description.

As appearing throughout this document, all stoichiometric formulations are provided by way of non-limiting example only and do not preclude the possibility that a named compound (e.g. a first oxide) may be present in a different stoichiometric proportions (e.g., as a second oxide) or may be present in non-stoichiometric proportions in at least some instances. As also appearing herein, the term "coating system" is utilized to refer to a multilayer coating containing two or more layers, which are chemically and/or morphology distinct. As still further appearing herein, statements indicating that a first layer is "bonded to," is "joined to," is "formed over," or is "formed on" a second layer or surface do not require that that the first layer is directly bonded to and intimately contacts the second layer or surface unless otherwise expressly stated. Finally, as appearing herein, the term "predominately" denotes that a material contains a majority of one or more named constituents, by wt % and/or by mol %.

Overview

The following describes methods for forming high temperature coating systems over selected surfaces of GTE components or other workpieces. The below-described high temperature coating systems are generally characterized by relatively low thermal conductivities or k values. For this reason, the following may describe the high temperature coating systems as assuming the form of a multilayer TBC system or containing one or more TBC layers. Embodiments of the below-described high temperature coating systems contain at least two coating layers: (i) a first thermally-insulative coating layer, which is formulated to provide relatively high fracture resistance (toughness) and other desirable properties at elevated operating temperatures, such as temperature approaching or exceeding approaching or exceeding 2000° F. (approximately 1090° C.), and (ii) a second thermally-insulative coating layer, which is formulated to provide enhanced CMAS-resistance and other desirable properties at such elevated operating temperatures. To help distinguish between these coating layers, the first thermally-insulative coating layer is referred to more fully herein as a "fracture-resistant TBC layer," while the second thermally-insulative coating layer is referred to herein as a "CMAS-resistant TBC layer." Such terminology does not preclude the possibility that the CMAS-resistant TBC layer may also have a relatively high fracture resistance or toughness at the intended operating temperatures of the high temperature coating system.

Embodiments of the high temperature coating system may include other coating layers in addition to the fracture-resistant TBC layer and the CMAS-resistant TBC layer. These other coating layers can include, for example, a base TBC layer and a bond coat layer. When present, the bond coat layer may be formed directly over (and thus intimately contact) a surface of the component body, while the base TBC layer may be formed directly over (and thus intimately contact) the bond coat layer. Similarly, the fracture-resistant TBC layer may be formed directly over (and intimately contact) the base TBC layer, while the CMAS-resistant TBC layer may be formed directly over (and intimately contact) the fracture-resistant TBC layer. Furthermore, in certain implementations, the CMAS-resistant TBC layer may constitute the outermost layer of the high temperature coating system such that, when the coating system is formed over a GTE component, the CMAS-resistant TBC layer may be directly exposed to core gas flow during GTE operation. In other implementations, the high temperature coating system can include multiple instances of the fracture-resistant TBC layer and the CMAS-resistant TBC layer, which may be repeated as bilayers pairs.

The fracture-resistant TBC layer is usefully formulated to contribute relatively high toughness levels, low k values, high oxidation and sinter resistance levels, and other desirable high temperature characteristics, as described more fully below. However, while providing such favorable high temperature characteristics, the fracture-resistant TBC layer may remain susceptible to structural degradation when subject to CMAS attack; e.g., depending upon layer formulation and other factors, the fracture-resistance TBC layer may exhibit a CMAS resistance similar to that of 6-8 wt % YSZ in at least some embodiments. In such embodiments, the fracture-resistant TBC layer may experience undesirably rapid thermochemical degradation when and if contacting molten, glass-like CMAS products in the GTE operative environment. Embodiments of the high temperature coating system address such CMAS vulnerability by shielding or physically protecting the fracture-resistant TBC layer with at least one overlying coating layer having an enhanced resistance to CMAS attack, namely, the below-described CMAS-resistant TBC layer. To serve this function, the CMAS-resistant TBC layer is advantageously formulated to achieve an enhanced resistance to CMAS attack. Specifically, the CMAS-resistant layer may be formed as a protective ceramic oxide barrier containing selected constituents, such as certain amounts of rare earth tantalates, found to react favorably with molten CMAS deposits at highly elevated temperatures in a manner protecting the underlying fracture-resistant TBC layer from undesired CMAS interactions.

The CMAS-resistant layer is usefully formulated to further provide other desirable high temperature properties including, for example, a relatively low k value approaching and possibly matching that of the fracture-resistant TBC layer. Of equal, if not greater importance, the CMAS-resistant TBC layer is formulated for optimal chemical compatibility with the fracture-resistant TBC layer to reduce or eliminate deleterious chemical species, which may otherwise develop along the interface between the CMAS-resistant and fracture-resistant TBC layers over time within the high temperature GTE environment. To ensure such chemical compatibility, the respective compositions of the CMAS-resistant and fracture-resistant TBC layers may be chosen in accordance with certain fundamental relationships or proportional rules, as discussed below in conjunction with FIGS. 1-4. Embodiments of the high temperature coating are well-suited for usage in protecting GTE components from high temperature failure modes of the type described in the foregoing section entitled "BACKGROUND." Accordingly, the following description will primarily discuss embodiments of the high temperature coating system in connection with GTE components. The following description notwithstanding, it will be understood that embodiments of the high temperature coating systems are not limited to exclusive usage in conjunction with GTE components, but rather can be formed over various different types of components and articles of manufacture including other types of turbomachine components.

Exemplary Embodiments of Coated GTE Components

FIG. 1 is an isometric view of a GTE component 10 having one or more surfaces over which a thermally-insulative, high temperature coating system is formed in accordance with teachings of the present disclosure. In this particular example, coated GTE component 10 is a turbine rotor blade piece and is thus referred to hereafter as "turbine rotor blade piece 10." This example notwithstanding, the following description is equally applicable to various other types of GTE components including, but not limited to, IGV structures, rotor blades, combustor liners, nozzle vanes, swirlers, heat shields, shrouds, duct members, and other components exposed to high temperature gas flow during GTE operation. Furthermore, in certain instances, the below-described thermally-insulative, high temperature coating system may be formed over selected surfaces of components, workpieces, and articles of manufacture other than GTE components, such as turbocharger components.

Turbine rotor blade piece 10 contains a rotor blade 12 and a platform 14 from which blade 12 extends. Rotor blade 12 includes, in turn, a blade root portion 16, a blade tip portion 18, a leading edge portion 20, and an opposing trailing edge portion 22. An insert-type attachment portion or shank 24 of turbine rotor blade piece 10 is joined to platform 14 opposite rotor blade 12. Shank 24 is produced to have an interlocking geometry, such as a fir tree or dovetail geometry. When turbine rotor blade piece 10 is integrated into a larger turbine rotor or wheel, shank 24 is inserted into mating slots provided around an outer circumferential portion of a separately-fabricated hub disk to prevent disengagement of rotor blade piece 10 during high speed rotation of the turbine rotor. Rotor blade 12 further includes a first face 26 (referred to hereafter "pressure side 26") and a second, opposing face 28 (hereafter "suction side 28"). As viewed from blade tip portion 18 toward blade root portion 16, rotor blade 12 is imparted with an airfoil-shaped geometry. Accordingly, pressure side 26 is imparted with a contoured, generally concave surface geometry, which bends or curves in three dimensions. Conversely, suction side 28 is imparted with a countered, generally convex surface geometry, which likewise bends or curves in multiple dimensions. In further embodiments, rotor blade 12 may include cooling features (e.g., internal passages, openings, and slots), a shroud portion integrally formed with blade tip portion 18, and other such structural features not shown in FIG. 1, but well-known within the industry.

As generically represented in FIG. 1 by dot stippling, a thermally-insulative, high temperature coating system is formed over one or more surfaces of turbine rotor blade piece 10. Broadly considered, such a high temperature coating system is desirably formed over pressure side 26, over suction side 28, and perhaps over blade tip portion 18 and/or platform 14 of turbine rotor blade piece 10. Such surfaces of turbine rotor blade piece 10 may be exposed to high temperature combustive gas flow during GTE operation and are thus usefully protected by such a high temperature coating system. Thus, in accordance with embodiments of the present disclosure, such a high temperature coating system is formed over selected surfaces of turbine rotor blade piece 10. The high temperature coating system usefully provides relatively high levels of thermal insulation, oxidation resistance, sinter resistance, and fracture resistance at elevated temperatures, while further providing relatively high resistance to CMAS attack. In so doing, the susceptibility of turbine rotor blade piece 10 to high temperature failure modes is decreased to prolong the service lifespan of rotor blade piece 10, even when exposed to highly elevated surface temperatures and gas velocities within the GTE environment. Exemplary embodiments of such high temperature coating systems and methods for fabricating such coating systems will now be described in conjunction with FIGS. 2-4.

Figure 2:
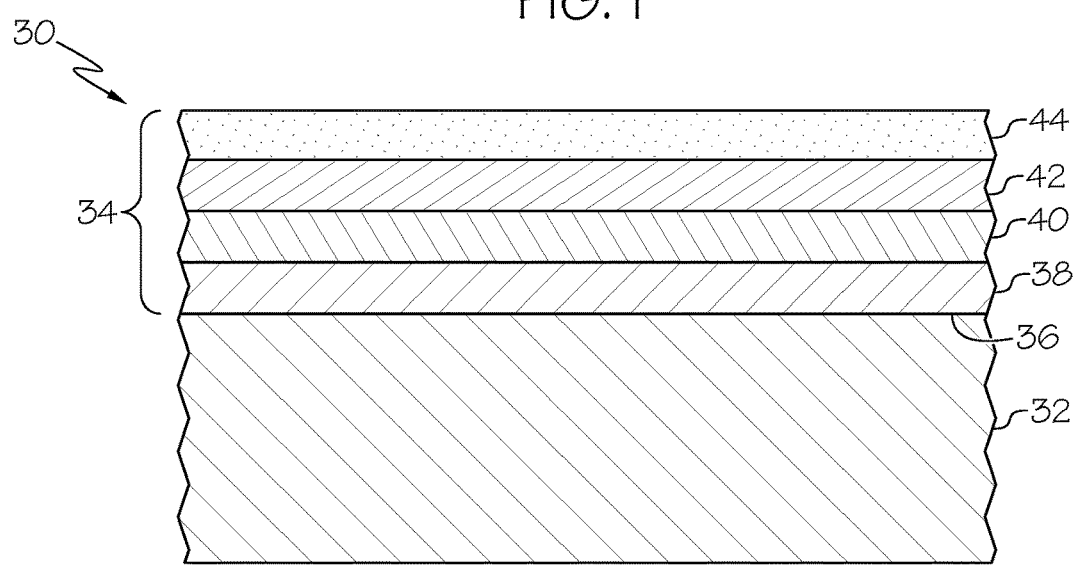
FIG. 2 is a cross-sectional schematic of the turbine rotor blade and the high temperature coating system shown in FIG. 1, as illustrated in accordance with a generalized and non-limiting example of the present disclosure.

FIG. 2 is a simplified cross-sectional view of a limited region of a coated GTE component 30, which includes a substrate or component body 32 over which a high temperature coating system 34 is formed. Specifically, high temperature coating system 34 is formed over a principal surface 36 of component body 32, which may be exposed to high temperature gas flow when GTE component 30 is deployed within an operative GTE. As shown in FIG. 2, the illustrated portion of coated GTE component 30 may correspond to a selected region of turbine rotor blade piece 10 shown in FIG. 1. In this case, component body 32 may represent a portion of blade 12 and may have a metallic composition typical of turbine rotor blades, such as a cobalt- or nickel-based superalloy. In further embodiments, component body 32 may have a different metallic or non-metallic composition and may assume forms other than that of a turbine rotor blade. Thus, as shown in FIG. 2, coated GTE component 30 is intended to generally represent any GTE component having at least one surface over which a high temperature coating system is formed in accordance with the teachings of this document.

In the example of FIG. 2, thermally-insulative, high temperature coating system 34 is produced to include four distinct coating layers: (i) a bond coat layer 38, (ii) a base TBC layer 40, (iii) a fracture-resistant TBC layer 42, and (iv) a CMAS-resistant TBC layer 44. These coating layers are each described, in turn, below. In further embodiments, high temperature coating system 34 may contain fewer or a greater number of coating layers, providing that coating system 34 includes at least one instance of fracture-resistant TBC layer 42 and CMAS-resistant TBC layer 44. For example, in alternative embodiments, high temperature coating system 34 may lack bond coat layer 38 and/or base TBC layer 40. In other embodiments, high temperature coating system 34 may include one or more additional layers formed over CMAS-resistant TBC layer 44, directly over surface 36 of component body 32, or between any neighboring layer pair. As a still further possibility, and as briefly noted above, high temperature coating system 34 may include multiple instances fracture-resistant TBC layer 42 and/or CMAS-resistant TBC layer 44, if desired, which may be present within coating system 34 as repeating bilayer pairs. Stated differently, in such embodiments, coating system 34 may include multiple instances of TBC layer 42 and of TBC layer 44, which are interspersed in an alternating pattern as taken along an axis orthogonal to component surface 36 over which high temperature coating system 34 is formed.

When present, bond coat layer 38 usefully provides a robust mechanical interface between component body 32 and base TBC layer 40. Accordingly, bond coat layer 38 may be formulated to provide a relatively high strength bond between component body 32 and base TBC layer 40 in the high temperature GTE environment. In certain embodiments, bond coat layer 38 may be a TGO layer, which is grown over and into component body 32. In other embodiments, bond coat layer 38 may be an aluminide coating, which is partially diffused into component body 32. In this latter case, bond coat layer 38 may be formed by depositing an aluminum-containing layer over surface 36 utilizing pack cementation, CVD, or another deposition process. The aluminum-containing layer may be composed of relatively pure aluminum or may instead contain other constituents, such as chromium or platinum, co-deposited with aluminum. A thermal diffusion process may then be conducted to form bond coat layer 38 as an aluminide coating layer. As a still further possibility, bond coat layer 38 may be produced as an overlay coating. In this case, bond coat layer 38 may be formed as an MCrAlX-based layer wherein M is an element selected from cobalt, nickel, or combinations thereof; while X is an element selected from the group consisting of hafnium, zirconium, yttrium, tantalum, rhenium, ruthenium, palladium, platinum, silicon, and combinations thereof. Suitable processes for producing MCrAlX coatings include CVD, plasma spray, and electroplating processes. In yet further embodiments, other formulations and depositions processes may be utilized to form bond coat layer 38, when present within high temperature coating system 34.

Base TBC layer 40 is formed over and may intimately contact bond coat layer 38. Base TBC layer 40 may be formulated to optimize chemical compatibility and bond strength with adjoining layers 38, 42. Base TBC layer 40 is also advantageously formulated for high temperature fracture resistance (toughness) and machinability. In various embodiments, base TBC layer 40 is predominately composed of zirconia ($ZrO_2$) by wt % and/or by mol %. Base TBC layer 40 may further contain lesser amounts of one or more additives, which enhance the stability and other such high temperature attributes of base TBC layer 40. For example, base TBC layer 40 may be composed of and, perhaps, may consist essentially of zirconia ($ZrO_2$) and about 1% to about 10% of at least one stabilizing oxide by wt %. A non-exhaustive list of suitable stabilizing oxides includes yttria ($Y_2O_3$), hafnia ($HfO_2$), and combinations thereof. In other implementations, base TBC layer 40 may contain and, perhaps, consists essentially of zirconia ($ZrO_2$) and about 6 to about 8 yttria ($Y_2O_3$) by wt %; the term "about," as appearing herein, denoting a disparity of less than 10%. In other embodiments, base TBC layer 40 can contain yttria ($Y_2O_3$), hafnia ($HfO_2$), or another stabilizing oxide present in an amount greater than or less than the aforementioned ranges. During formation of high temperature coating system 34, base TBC layer 40 can be produced from a coating precursor material deposited utilizing different deposition processes, including EB-PVD and plasma spray deposition techniques. Heat treatment may be performed after deposition of the coating precursor material, as appropriate.

Fracture-resistant TBC layer 42 is usefully formulated to provide relatively low thermal conductivity or k values, relatively high fracture resistance (toughness), and other desirable high temperature properties. In various embodiments, fracture-resistant TBC layer 42 may be predominately composed of zirconia ($ZrO_2$), tantala ($Ta_2O_5$), niobia ($NbO_2$ or $Nb_2O_5$), or a combination thereof, as measured by wt % or by mol %. Fracture-resistant TBC layer 42 may also contain lesser amounts of other constituents or dopants, such stabilizing oxides, in at least some embodiments. A non-exhaustive list of suitable stabilizing oxides includes yttria ($Y_2O_3$), ytterbia ($Yb_2O_3$), gadolinia ($Gd_2O_3$), and lanthanum oxide ($La_2O_3$). In one specific implementation, and by way of non-limiting example only, fracture-resistant TBC layer 42 is predominately composed of and, possibly, consists essentially of tantala ($Ta_2O$), zirconia ($ZrO_2$), yttria ($Y_2O_3$), and ytterbia ($Yb_2O_3$), as measured by wt % and/or by mol %. Further examples of formulations suitable for fracture-resistant TBC layer 42 are set-forth below. Certain ones of the following formulations are also disclosed in the following co-pending patent application, which is hereby incorporated in its entirety: U.S. patent application Ser. No. 14/312,869, entitled "THERMAL BARRIER COATINGS FOR TURBINE ENGINE COMPONENTS," filed with the USPTO on Jun. 24, 2014, and assigned to the assignee of the instant Application.

In further implementations of high temperature coating system 34, fracture-resistant TBC layer 42 may contain zirconia ($ZrO_2$), tantala ($Ta_2O_5$), and at least first and second stabilizers. The first stabilizer (hereafter, "stabilizer A") may be yttria ($Y_2O_3$), lanthanum oxide ($La_2O_3$), or a combination thereof. The second stabilizer (hereafter, "stabilizer B") may be ytterbia ($Yb_2O_3$), gadolinia ($Gd_2O_3$), or a combination thereof. In such embodiments, fracture-resistant TBC layer 42 may contain the following constituents, as expressed in mol %: about 1% to about 30% stabilizer A, about 1% to about 30% stabilizer B, about 1% to about 30% tantala ($Ta_2O_5$), about 0% to about 10% hafnia ($HfO_2$), and a balance of zirconia ($ZrO_2$). In a further embodiment, fracture-resistant TBC layer 42 may contain the following constituents, as expressed in mol %: about 5% to about 30% stabilizer A, about 5% to about 30% stabilizer B, about 5% to about 30% tantala ($Ta_2O_5$), about 0.1% to about 10% hafnia ($HfO_2$), and a balance of zirconia ($ZrO_2$). In yet another embodiment, fracture-resistant TBC layer 42 may contain the following constituents, as expressed in mol %: about 10% to about 15% stabilizer A, about 10% to about 15% stabilizer B, about 10% to about 20% tantala ($Ta_2O_5$), about 0.1% to about 2% hafnia ($HfO_2$), and a balance of zirconia ($ZrO_2$).

In various other implementations of coating system 34, fracture-resistant TBC layer 42 may contain the following constituents, as expressed in mol %: about 1% to about 30% yttria ($Y_2O_3$), about 1% to about 30% gadolinia ($Gd_2O_3$) or ytterbia ($Yb_2O_3$), about 1% to about 30% tantala ($Ta_2O_5$), about 0% to about 10% hafnia ($HfO_2$), and a balance of zirconia ($ZrO_2$). In another embodiment, fracture-resistant TBC layer 42 may contain the following constituents, as expressed in mol %: about 5% to about 30% yttria ($Y_2O_3$), about 5% to about 30% gadolinia ($Gd_2O_3$) or ytterbia ($Yb_2O_3$), about 5% to about 30% tantala ($Ta_2O_5$), about 0.1% to about 10% hafnia ($HfO_2$), and a balance of zirconia ($ZrO_2$). In yet another embodiment, fracture-resistant TBC layer 42 may contain the following constituents, as expressed in mol %: about 10% to about 15% yttria ($Y_2O_3$), about 10% to about 15% gadolinia ($Gd_2O_3$) or ytterbia ($Yb_2O_3$), about 10% to about 20% tantala ($Ta_2O_5$), about 0.1% to about 2% hafnia ($HfO_2$), and a balance of zirconia ($ZrO_2$).

In still other embodiments of coating system 34, fracture-resistant TBC layer 42 may contain the following constituents, as expressed in mol %: about 1% to about 30% ytterbia ($Yb_2O_3$), about 1% to about 30% gadolinia ($Gd_2O_3$), about 1% to about 30% tantala ($Ta_2O_5$), about 0% to about 10% hafnia ($HfO_2$), and a balance of zirconia ($ZrO_2$). In another embodiment, fracture-resistant TBC layer 42 may contain the following constituents, as expressed in mol %: about 5% to about 30% ytterbia ($Yb_2O_3$), about 5% to about 30% gadolinia ($Gd_2O_3$), about 5% to about 30% tantala ($Ta_2O_5$), about 0.1% to about 10% hafnia ($HfO_2$), and a balance of zirconia ($ZrO_2$). In yet another embodiment, fracture-resistant TBC layer 42 may contain about 10% to about 15% ytterbia ($Yb_2O_3$), about 10% to about 15% gadolinia ($Gd_2O_3$), about 10% to about 20% tantala ($Ta_2O_5$), about 0.1% to about 2% hafnia ($HfO_2$), and a balance of zirconia ($ZrO_2$), with all aforementioned percentages expressed in mol %.

Addressing TBC layer 44, CMAS-resistant TBC layer 44 may have a formulation that is similar to, but differs materially with respect to the formulation of fracture-resistant TBC layer 42. For example, as does fracture-resistant TBC layer 42, CMAS-resistant TBC layer 44 may contain zirconia ($ZrO_2$) as a primary constituent; however, the zirconia ($ZrO_2$) content of CMAS-resistant TBC layer 44 will typically be less than that of fracture-resistant TBC layer 42. In addition to zirconia ($ZrO_2$), CMAS-resistant TBC layer 44 may also contain selected amounts of tantala ($Ta_2O_5$), at least one rare earth oxide (generally abbreviated herein as "REO"), and possibly other metallic or non-metallic constituents. In certain cases, CMAS-resistant TBC layer 44 may consist essentially of zirconia ($ZrO_2$), tantala ($Ta_2O_5$), and the selected rare earth oxide or oxides, as described more fully below. In other embodiments, CMAS-resistant TBC layer 44 may contain other ingredients, such as lesser amounts of stabilizing oxides, in addition to zirconia ($ZrO_2$), tantala ($Ta_2O_5$), and the selected rare earth oxide or oxides. For example, in some implementations, the below-described tantala ($Ta_2O_5$), content of CMAS-resistant TBC layer 44 may be partially replaced with niobia ($NbO_2$ or $Nb_2O_5$), in which case the niobia ($NbO_2$ or $Nb_2O_5$) content of CMAS-resistant TBC layer 44 will typically be (but is not essentially) less than the tantala ($Ta_2O_5$) content of TBC layer 44.

In one embodiment, CMAS-resistant TBC layer 44 may contain and, perhaps, may consist essentially of the following, with all percentages expressed in mol %: about 0.1% to about 35% zirconia ($ZrO_2$), about 30% to about 40% tantala ($Ta_2O_5$), and about 30% to about 40% of the selected rare earth oxide or oxides. Similarly, in other embodiments, CMAS-resistant TBC layer 44 may contain and, perhaps, may consist essentially of the following, with all percentages expressed in wt %: 0.1% to about 35% zirconia ($ZrO_2$), about 35% to about 55% tantala ($Ta_2O_5$), and about 25% to about 40% of the selected rare earth oxide or oxides. A non-exhaustive list of rare earth oxides potentially contained in CMAS-resistant TBC layer 44 includes gadolinia ($Gd_2O_3$), lanthanum oxide ($La_2O_3$), lutetium oxide ($Lu_2O_3$) neodymium oxides ($Nd_2O_3$), samarium oxide ($Sm_2O_3$), scandium oxide ($Sc_2O_3$), terbium oxide ($Tb_2O_3$), ytterbia ($Yb_2O_3$), and yttria ($Y_2O_3$). In certain useful implementations, the rare earth oxide or oxides contained in CMAS-resistant TBC layer 44 may be selected from the group consisting of gadolinia ($Gd_2O_3$), lanthanum oxide ($La_2O_3$), ytterbia ($Yb_2O_3$), and yttria ($Y_2O_3$), as well as combinations thereof. In one specific, albeit non-limiting implementation, the selected rare earth oxide contains or consists essentially of gadolinia ($Gd_2O_3$), which has been found to be especially prone to favorable reactions with CMAS products within the high temperature GTE environment. Thus, selecting the rare earth oxide content of CMAS-resistant TBC layer 44 to be predominately composed of (by mol % or wt %) or to consist essentially of gadolinia ($Gd_2O_3$) may boost the ability of TBC layer 44 to shield underlying fracture-resistant TBC layer 42 from CMAS attack in at least some instances.

The respective thicknesses of CMAS-resistant TBC layer 44 and fracture-resistant TBC layer 42 may each range from about 0.5 micron (μm) to about 250 μm, and perhaps from about 5 μm to about 50 μm, an embodiments. In other embodiments, one or both of TBC layers 42, 44 may be thicker or thinner than the aforementioned ranges. In certain implementations, it may be desirable to minimize the thickness of CMAS-resistant TBC layer 44 to the extent practical, while retaining the ability of TBC layer 44 to serve as a CMAS-protective barrier overlying fracture-resistant TBC layer 42. In such embodiments, CMAS-resistant TBC layer may have a thickness less than half that of fracture-resistant TBC layer 42 and/or base TBC layer 40. TBC layers 42, 44 may be substantially homogeneous in composition or may be formed to have a graded composition, as taken through the thickness of high temperature coating system 34 and as discussed below in conjunction with FIG. 4.

By way of example, various illustrative compositional ranges for fracture-resistant TBC layer 42 and CMAS-resistant TBC layer 44 have been set-forth above. While the foregoing has generally discussed the exemplary compositions of fracture-resistant TBC layer 42 and CMAS-resistant TBC layer 44 separately or sequentially, it should be emphasized that the compositions of TBC layers 42, 44 are usefully selected in relation to one another and, specifically, such that the respective compositions of TBC layers 42, 44 are mutually tailored to achieve an optimal chemical compatibility between these layers, as taken over the lifespan of high temperature coating system 34 within its intended operating environment. Certain rules or proportional relationships have been discovered, which, when followed in selecting the compositions of TBC layers 42, 44, may favorably optimize chemical compatibility between fracture-resistant TBC layer 42 and CMAS-resistant TBC layer 44. The following rules or proportional relationships also apply to the formulations of the coating precursor materials from which TBC layers 42, 44 are produced, as described more fully below.

Figure 3:
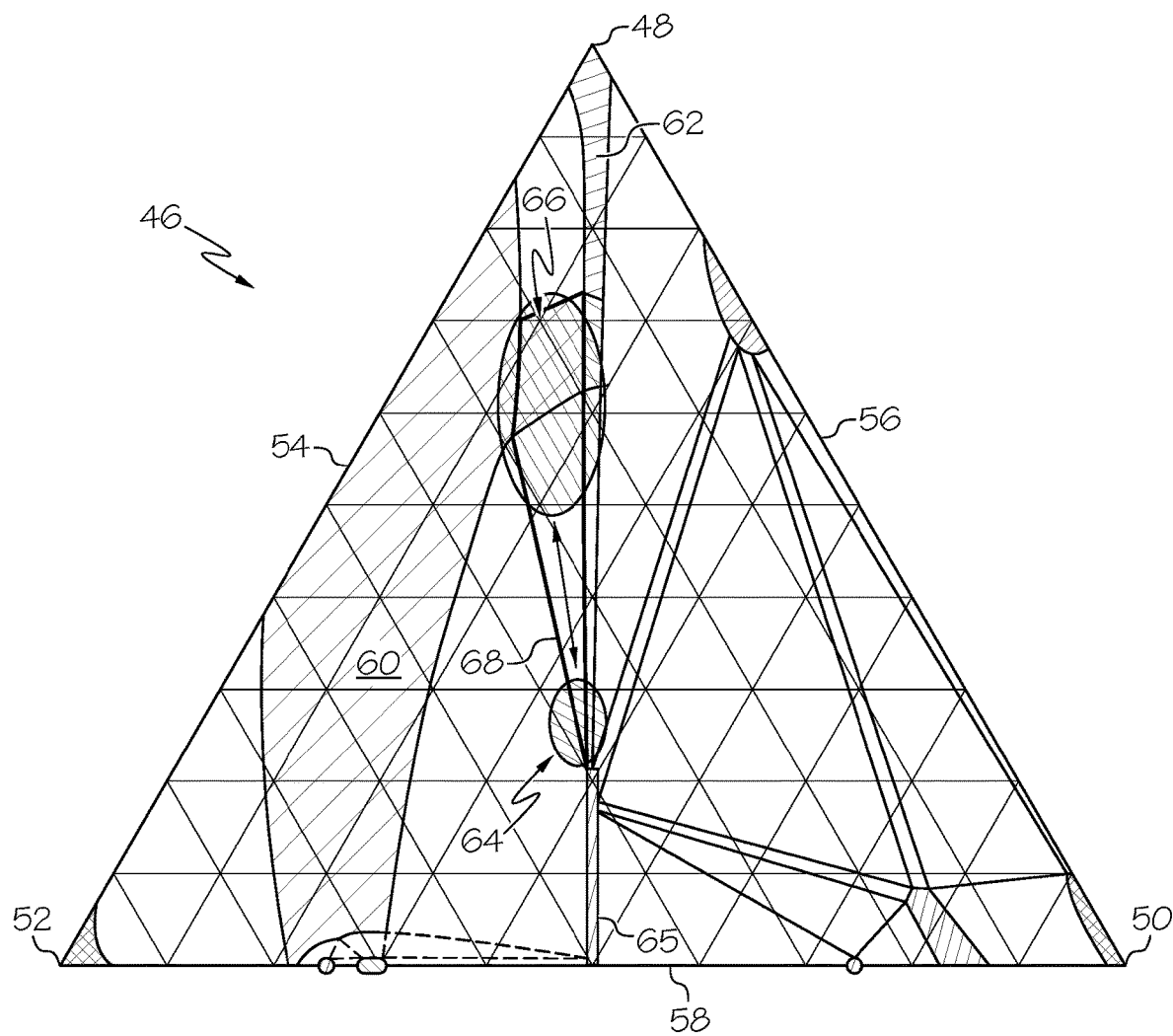
FIG. 3 is a ternary phase diagram visually demarcating possible compositional ranges of the fracture-resistant and CMAS-resistant TBC layers contained in the high temperature coating system shown in FIG. 2 in an exemplary embodiment of the present disclosure.

FIG. 3 sets-forth a ternary phase diagram 46 demarcating possible compositional ranges of CMAS-resistant TBC layer 44 in an exemplary embodiment of high temperature coating system 34 (FIG. 2). Broadly considered, ternary phase diagram 46 is adapted from a similar diagram appearing in the following resource: C. A. Macauley, A. N. Fernandez, C. G. Levi, Phase equilibria in the ZrO2-YO1.5-TaO2.5 system at 1500° C., as published in Journal of the European Ceramic Society. Ternary phase diagram 46 assumes the form of a triangular graphic having three corners or vertices 48, 50, 52 and three sides 54, 56, 58. In diagram 46, zirconia ($ZrO_2$) concentration ranges from 100 mol % at apex 48 to 0 mol % at opposing side 58 and decreasing gradually when moving from apex 48 downward toward side 58. Similarly, tantala ($Ta_2O_5$) concentration decreases gradually from 100 mol % at vertex 50 to 0 mol % when moving from vertex 50 toward opposing side 54. Finally, the concentration of the selected rare earth oxide or oxides in CMAS-resistant TBC layer 44 likewise decreases gradually from 100 mol % at vertex 52 to 0 mol % when moving toward opposing side 56. Certain regions of within diagram 46 are further identified in FIG. 3, which represent different phases in an equilibrium reached over prolonged exposure to the intended high temperature operative environment of coating system 34 (FIG. 2). Of particular relevance in this example, regions 60 and 62 represent the cubic solid solution and tetragonal solid solution phases, respectively, of the chemical species contained in TBC layers 42, 44.

In ternary phase diagram 46 (FIG. 3), ovular marker 64 generally indicates the composition of CMAS-resistant TBC layer 44 in an exemplary embodiment in which TBC layer 44 contains zirconia ($ZrO_2$), tantala ($Ta_2O_5$), and at least one selected rare earth oxide. Additionally, thin rectangular marker 65 located beneath ovular marker 64 in diagram 46 further represents the tantalate solid solution phase, which, in a general sense, may serve as a foundational backbone or baseline for the CMAS-resistant chemistries described herein in at least some implementations. In many of the cases described herein, the tantala content of CMAS-resistant TBC layer 44 may lie within the general range jointly spanned by markers 64, 65, although this need not be the case in all embodiments. For comparison purposes, ternary phase diagram 46 further includes a ovular marker 66, which generally indicates a content range of zirconia ($ZrO_2$) potentially included in fracture-resistant TBC layer 42 in an embodiment. Notably, the inclusion of ovular marker 66 in diagram 46 does not indicate that fracture-resistant TBC layer 42 necessarily contains either tantala ($Ta_2O_5$) or the selected rare earth oxide(s) in amounts similar to those included in CMAS-resistant TBC layer 44. Instead, as described above and further discussed below, fracture-resistant TBC layer 42 may contain a selected amount of tantala ($Ta_2O_5$), but in a lesser amount than does CMAS-resistant TBC layer 44. Additionally, fracture-resistant TBC layer 42 may or may not contain one or more of the selected rare earth oxide(s) included in CMAS-resistant TBC layer 44. Extending between markers 64, 66, graphic 68 generally identifies an optimal zone for chemical species compatibility considered over a prolonged operational lifespan within the high temperature GTE environment.

As graphically indicated in FIG. 3, fracture-resistant TBC layer 42 (marker 66) may be produced to have a zirconia ($ZrO_2$) content that is greater than and, perhaps, at least twice that of CMAS-resistant TBC layer 44 (marker 64). Additionally, as suggested by the central location of marker 64 within ternary phase diagram 46, CMAS-resistant TBC layer 44 is usefully imparted with substantially equivalent amounts of tantala ($Ta_2O_5$) and the selected rare earth oxide(s), as considered in mol %; the term "substantially equivalent," as appearing herein, denoting a disparity of less than 10 mol %. Accordingly, in various implementations of high temperature coating system 34 (FIG. 2), CMAS-resistant TBC layer 44 may be formed to have a zirconia ($ZrO_2$) content less than that of fracture-resistant TBC layer 42 and a tantala ($Ta_2O_5$) content that is substantially equivalent to the selected rare earth content of TBC layer 44; e.g., in an embodiment, the tantala ($Ta_2O_5$) content of TBC layer 44 may be substantially equivalent (that is, differ by less than 10 mol %) relative to the cumulative content of gadolinia ($Gd_2O_3$), lanthanum oxide ($La_2O_3$), ytterbia ($Yb_2O_3$), and/or yttria ($Y_2O_3$) further included within TBC layer 44.

Figure 4:
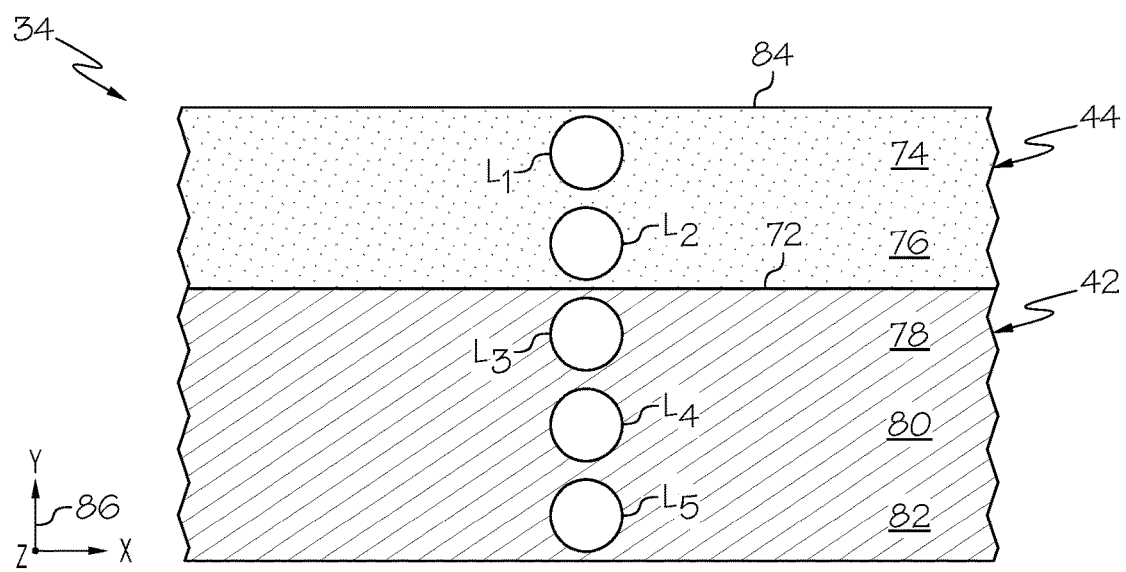
FIG. 4 is a more detailed view of the fracture-resistant TBC layer and the CMAS-resistant TBC layer contained in the high temperature coating system of FIG. 2 and appended to include symbology identifying different locations within the coating system at which layer composition may vary in, for example, a graded or stepwise manner.

Turning now to FIG. 4, a more detailed view of fracture-resistant TBC layer 42 and CMAS-resistant TBC layer 44 is presented. FIG. 4 is appended to circular graphics $L_1$-$L_5$, which identify selected locations within TBC layers 42, 44 at which layer composition may differ when TBC layer 42 and/or TBC layer 44 are produced to contain one or more constituents distributed as a gradient. In this drawing figure, the interface between TBC layers 42, 44 is identified by reference numeral "72." Interface 72 also corresponds to the inner principal surface of CMAS-resistant TBC layer 44 and the outer principal surface of fracture-resistant TBC layer 42; the terms "outer" and "inner," as appearing herein, defined with respect to their respective proximity to the component surface over which high temperature coating system 34 is formed, such as surface 36 of component body 32 shown in FIG. 2. As further labeled in FIG. 4 and referenced below, CMAS-resistant TBC layer 44 includes an outer portion 74 and an inner portion 76, which are opposed along axis orthogonal to outer principal surface 84 of TBC layer 44 (corresponding to the Y-axis of coordinate legend 86 appearing in the bottom left corner of FIG. 4). Similarly, fracture-resistant TBC layer 42 includes an outer portion 78, an intermediate portion 80, and an inner portion 82. Inner portion 82 of fracture-resistant TBC layer 42 is located substantially opposite CMAS-resistant TBC layer 44, as taken along axis orthogonal to outer principal surface 84 (again, corresponding to the Y-axis of coordinate legend 86).

In certain embodiments, one or more constituents contained within CMAS-resistant TBC layer 44 may vary in concentration, as taken through the thickness of TBC layer 44. Thus, in such embodiments, the composition of outer portion 74 of CMAS-resistant TBC layer 44 (generally corresponding to location $L_1$ in FIG. 4) may differ as compared to the composition of inner portion 76 of TBC layer 44 (corresponding to location $L_2$ in FIG. 4). Such a graded composition may vary in a gradual manner or, instead, in a stepwise fashion as moving the coating layer thickness. Such compositional gradients can be created by, for example, varying the rate at which multiple ingots are vaporized when an EB-PVD process is utilized to deposit the coating precursor layer from which CMAS-resistant TBC layer 44 is formed; or controlling the powder flow rate from multiple different powder feeds when an APS or other spray process is utilized to deposit the coating precursor layer from which TBC layer 44 is formed. In still further embodiments, TBC layer 44 may have a substantially homogenous composition through its thickness such that the composition of outer portion 74 of TBC layer 44 is substantially equivalent to the composition inner portion 76.

As is the case with CMAS-resistant layer 44, one or more constituents contained within fracture-resistant TBC layer 42 may vary in concentration, as taken through the thickness of layer TBC layer 42. In such implementations, the composition of outer portion 78 of fracture-resistant TBC layer 42 (generally corresponding to location $L_3$ in FIG. 4) may differ as compared to the composition of intermediate portion 80 of TBC layer 42 (corresponding to location $L_4$ in FIG. 4), which may, in turn, differ as compared to the composition of inner portion 82 of TBC layer 42 (corresponding to location $L_5$ in FIG. 4). Consider, for example, an embodiment in which a controlled heat treatment process is performed after formation of CMAS-resistant TBC layer 44 over fracture-resistant TBC layer 42 to diffuse the selected rare earth oxide or oxides within TBC layer 44 into TBC layer 42. Accordingly, fracture-resistant TBC layer 42 may be imparted with a rare earth oxide gradient that gradually decreases from a maximum value to a minimum value when moving through the thickness of TBC layer 42 away from layer-to-layer interface 72. In such embodiments, fracture-resistant TBC layer 42 may have a maximum concentration of the selected rare earth oxide(s) at or adjacent layer-to-layer interface 72 (and, therefore, within outer portion 78 of TBC layer 42) and a minimum concentration of the selected rare earth oxide(s) within intermediate portion 80 or inner portion 82 of TBC layer 42, depending upon the depth of diffusion.

In implementations in which a rare earth oxide gradient is created within fracture-resistant TBC layer 42, the rare earth oxide gradient may decrease to approximately 0 mol % when moving away from interface 72 and CMAS-resistant TBC layer 44. For example, in one embodiment, fracture-resistant TBC layer 42 may be formed from a coating precursor material that is essentially free of the selected rare earth oxide(s) (e.g., gadolinia) such that, prior to the diffusion process, fracture-resistant TBC layer 42 lacks the selected rare earth oxide(s). Subsequently, following formation of CMAS-resistant TBC layer 44, a heat treatment process is carried-out in an oven or furnace to diffuse the selected rare earth oxide(s) (e.g., gadolinia) into fracture-resistant TBC layer 42. If desired, the diffusion process may be controlled such that the depth of the resulting selected rare earth oxide gradient does not penetrate fully through fracture-resistant TBC layer 42. Thus, in such implementations, TBC layer 42 may contain a maximum concentration of the selected rare earth oxides (e.g., gadolinia) at or adjacent layer-to-layer interface 72, while TBC layer 42 is substantially free of the selected rare earth oxides (e.g., gadolinia) adjacent its inner surface; that is, within inner portion 82 opposite CMAS-resistant TBC layer 44 (corresponding to location $L_5$ shown in FIG. 4).

CONCLUSION

There has thus been provided embodiments of high temperature coating systems including CMAS-resistant TBC layers combined with fracture-resistant TBC layers. The CMAS-resistant TBC layer is formulated for chemical compatibility with the underlying fracture-resistant TBC layer. Certain combinations of rare earth oxides, zirconia ($ZrO_2$), and tantala ($Ta_2O_5$) have been identified as optimal for this purpose, as discussed in detail above. Advantageously, embodiments of the high temperature coating system are capable of providing excellent thermal insulation, oxidation resistance, and fracture resistance characteristics at elevated temperatures, while further providing relatively high resistance to CMAS attack. Thus, when formed over a GTE component, the high temperature coating system may enhance the temperature capabilities of the coated GTE component allowing the component to maintain optimal performance levels at higher temperatures and for longer service lifespans, while reducing maintenance requirements. This, in turn, may help support operation of the GTE at higher core temperatures to improve fuel efficiency, emission levels, thrust-to-weight ratios, and other measures of GTE performance. This notwithstanding, the temperature coating systems described herein are not limited to usage in conjunction with any particular type of GTE component and, in certain instances, may be formed over components, structures, and bodies other than GTE components.

The foregoing description has also set-forth embodiments of methods for forming high temperature coating systems over selected surfaces of workpieces, such as GTE components. In certain embodiments, the method may include the step or process of forming a fracture-resistant TBC layer over a surface of the component. The fracture-resistant TBC layer formed from a first coating precursor material containing a non-trace amount of zirconia by mol % ($ZrO_{mol\%1}$), and a non-trace amount of tantala by mol % ($TaO_{mol\%1}$). Similarly, the method may further include the step or process of forming a CMAS-resistant TBC layer over the fracture-resistant TBC layer. The CMAS-resistant TBC layer may be formed from a second coating precursor material containing a non-trace amount of zirconia by mol % ($ZrO_{mol\%2}$), a non-trace amount of tantala by mol % ($TaO_{mol\%2}$), and a non-trace amount of at least one rare earth oxide by mol % ($REO_{mol\%2}$). In an embodiment, the first and second coating precursor materials may be formulated such that $ZrO_{mol\%1}$ is greater than $ZrO_{mol\%2}$, $TaO_{mol\%1}$ is less than $TaO_{mol\%2}$, and $TaO_{mol\%2}$ is substantially equivalent to $REO_{mol\%2}$. Any suitable deposition process may be utilized to apply the first and second coating precursor materials, depending upon whether the coating precursor materials are applied in a wet state or a dry state. A non-exhaustive list of suitable deposition techniques includes painting, rolling, taping, screen printing, doctor blading, spin-coating, spray-coating, suspension/slip casting, dip-coating, dry film transfer processes, and vapor deposition processes, to list but a few examples.

In various embodiments, the method may further include the step or process of selecting the at least one rare earth oxide selected from the group consisting of yttria, ytterbia, gadolinia, and lanthanum oxides, and combinations thereof. Additionally or alternatively, the first coating precursor material may be formulated to contain a non-trace amount of the at least one rare earth oxide by mol % ($REO_{mol\%1}$), with $REO_{mol\%1}$ being less than $REO_{mol\%2}$ and, perhaps, less than one half $REO_{mol\%2}$. In other embodiments, the first coating precursor material may be formulated to be essentially free of the at least one rare earth oxide, $ZrO_{mol\%1}$ may be selected to be at least twice $ZrO_{mol\%2}$, and/or the method may further include the step or process of forming the CMAS-resistant TBC layer as an outermost layer of the high temperature coating system such that the CMAS-resistant TBC layer is directly exposed to core gas flow during GTE operation. In yet further implementations, the method may further include the production of a base TBC layer over the surface of the component prior to forming the fracture-resistant TBC layer thereover, with the base TBC layer formulated to contain zirconia in an amount exceeding $ZrO_{mol\%1}$ by mol %.

In still further embodiments, the step or processes of forming the CMAS-resistant TBC layer can include: (i) depositing the second coating material directly onto the fracture-resistant TBC layer; and (ii) after deposition of the second coating material, heat treating the second coating material to diffuse the at least one rare earth oxide into the fracture-resistant TBC layer and form a rare earth oxide gradient therein. In other embodiments, the method can include the steps or processes of: (i) producing the fracture-resistant TBC layer to include an outer surface to which the CMAS-resistant TBC layer is bonded and an inner surface opposite the outer surface; and (ii) formulating the first coating precursor material and heat treating the second coating material such that the rare earth oxide gradient decreases from a maximum value to a minimum value when moving from the outer surface toward the inner surface. Finally, in some implementations, the second coating precursor material may be formulated such that $ZrO_{mol\%2}$ is between about 0.1% and about 35% by mol %, $TaO_{mol\%2}$ is between about 30% and about 40% by mol %, and $REO_{mol\%2}$ is between about 30% and about 40% by mol %.

In still further embodiments, the method includes the step or process of forming a fracture-resistant TBC layer over a surface of a component, such as a GTE component. The fracture-resistant TBC layer contains about 25% to about 75% zirconia by wt %. Additionally, the fracture-resistant TBC layer may further contain about 1% to about 30% tantala by wt %, more preferably about 5% to about 30% tantala by wt %, and still more preferably about 10% to about 25% tantala by wt %. A CMAS-resistant TBC layer is formed on and, perhaps, in intimate contact with the fracture-resistant TBC layer. The CMAS-resistant TBC layer contains 0% to about 25% zirconia by wt %, about 35% to about 55% tantala by wt %, and about 25% to about 40% of at least one rare earth oxide by wt %. In certain cases, the at least one rare earth oxide may be selected from the group consisting of yttria, ytterbia, gadolinia, and lanthanum oxides, and combinations thereof. Additionally, in some implementations, the method may further include the steps or processes of: (i) producing the fracture-resistant TBC layer to include an outer surface to which the CMAS-resistant TBC layer is bonded and an inner surface opposite the outer surface; and (ii) diffusing the at least one rare earth oxide into the fracture-resistant TBC layer such that the fracture-resistant TBC layer contains a rare earth oxide gradient, which decreases from a maximum value to a minimum value when moving from the outer surface toward the inner surface of the fracture-resistant layer. In such embodiments, the at least one rare earth oxide may be selected to comprise gadolinia; and the at least one rare earth oxide may be diffused into the fracture-resistant TBC layer such that the fracture-resistant TBC layer contains a gadolinia gradient, which decreases from a maximum gadolinia concentration to a minimum gadolinia concentration when moving from the outer surface toward the inner surface of the fracture-resistant layer, the minimum gadolinia concentration substantially equivalent to 0% by mole percent.

While multiple exemplary embodiments have been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended Claims.

What is claimed is:

1. A method for producing a high temperature coating system over a component, the method comprising:
   forming a fracture-resistant Thermal Barrier Coating (TBC) layer over a surface of the component, the fracture-resistant TBC layer formed from a first coating precursor material containing:
      an amount of zirconia by mole percent ($ZrO_{mol\%1}$); and
      an amount of tantala by mole percent ($TaO_{mol\%1}$);
   forming a Calcium-Magnesium Aluminosilicate-resistant (CMAS-resistant) TBC layer over the fracture-resistant TBC layer, the CMAS-resistant TBC layer formed from a second coating precursor material containing:
      an amount of zirconia by mole percent ($ZrO_{mol\%2}$) between about 0.1% and about 35%;

an amount of tantala by mole percent ($TaO_{mol\%2}$) between about 30% and about 40%; and an amount of at least one rare earth oxide by mole percent ($REO_{mol\%2}$) between about 30% and about 40%;

wherein $ZrO_{mol\%1}$ is greater than $ZrO_{mol\%2}$, $TaO_{mol\%1}$ is less than $TaO_{mol\%2}$, and $TaO_{mol\%2}$ is substantially equivalent to $REO_{mol\%2}$.

2. The method of claim 1 further comprising selecting the at least one rare earth oxide selected from the group consisting of yttria, ytterbia, gadolinia, and lanthanum oxides, and combinations thereof.

3. The method of claim 1 further comprising formulating the first coating precursor material to contain an amount of at least one rare earth oxide by mole percent ($REO_{mol\%1}$); wherein $REO_{mol\%1}$ is less than $REO_{mol\%2}$.

4. The method of claim 3 further comprising selecting $REO_{mol\%2}$ to be at least twice $REO_{mol\%1}$.

5. The method of claim 1 further comprising formulating the first coating precursor material to be essentially free of the at least one rare earth oxide.

6. The method of claim 1 further comprising selecting $ZrO_{mol\%1}$ to be at least twice $ZrO_{mol\%2}$.

7. The method of claim 1 wherein forming the CMAS-resistant TBC layer comprises:

depositing the second coating material directly onto the fracture-resistant TBC layer; and after deposition of the second coating material, heat treating the second coating material to diffuse the at least one rare earth oxide into the fracture-resistant TBC layer and form a rare earth oxide gradient therein.

8. The method of claim 7 further comprising:

producing the fracture-resistant TBC layer to include an outer surface to which the CMAS-resistant TBC layer is bonded and an inner surface opposite the outer surface; and formulating the first coating precursor material and heat treating the second coating material such that the rare earth oxide gradient decreases from a maximum value to a minimum value when moving from the outer surface toward the inner surface.

9. The method of claim 1 further comprising:

producing a base TBC layer over the surface of the component prior to forming the fracture-resistant TBC layer thereover; and formulating the base TBC layer to contain zirconia in an amount exceeding $ZrO_{mol\%1}$ by mole percent.

10. The method of claim 1 wherein the component comprises a Gas Turbine Engine (GTE) component; and wherein the method further comprises forming the CMAS-resistant TBC layer as an outermost layer of the high temperature coating system such that the CMAS-resistant TBC layer is directly exposed to core gas flow during GTE operation.

11. The method of claim 1 further comprising:

selecting the at least one rare earth oxide to comprise gadolinia; and diffusing the at least one rare earth oxide into the fracture-resistant TBC layer such that the fracture-resistant TBC layer contains a gadolinia gradient, which decreases from a maximum gadolinia concentration to a minimum gadolinia concentration when moving from the outer surface toward the inner surface of the fracture-resistant layer, the minimum gadolinia concentration substantially equivalent to 0% by mole percent.

12. The method of claim 1 further comprising selecting the at least one rare earth oxide selected from the group consisting of gadolinia, lanthanum oxides, and combinations thereof.

13. The method of claim 1 wherein the at least one rare earth oxide is a combination of gadolinia and a lanthanum oxide.

* * * * *